United States Patent [19]
Maier et al.

[11] Patent Number: 6,046,516
[45] Date of Patent: Apr. 4, 2000

[54] ELECTRONIC SWITCH FOR USE WITH INDUCTIVE LOADS

[75] Inventors: Reinhard Maier, Herzogenaurach; Hermann Zierhut, deceased, late of Neutraubling, by Ingeborg Zierhut, heir; Heinz Mitlehner, Uttenreuth, all of Germany

[73] Assignee: Siemens Aktiengesellschaft, Munich, Germany

[21] Appl. No.: 08/836,025

[22] PCT Filed: Oct. 28, 1994

[86] PCT No.: PCT/DE94/01273

§ 371 Date: Oct. 14, 1997

§ 102(e) Date: Oct. 14, 1997

[87] PCT Pub. No.: WO96/13900

PCT Pub. Date: May 9, 1996

[51] Int. Cl.[7] .................................................. H01H 47/00
[52] U.S. Cl. .............................................. 307/125; 307/112
[58] Field of Search ................................. 327/110, 424, 327/314, 325; 307/112, 116, 125, 130, 131

[56] References Cited

U.S. PATENT DOCUMENTS

| | | |
|---|---|---|
| 5,038,266 | 8/1991 | Callen et al. . |
| 5,170,231 | 12/1992 | Fujii et al. . |
| 5,287,046 | 2/1994 | Carpenter et al. . |
| 5,430,366 | 7/1995 | Erckert et al. . |

*Primary Examiner*—Richard T. Elms
*Attorney, Agent, or Firm*—Kenyon & Kenyon

[57] ABSTRACT

An electronic switch with a switching element of the type of a semiconductor switch with the mode of operation of at least one FET, so that due to the technology it also has an internal body diode in inverse operation. A control circuit for executing the operating commands is set up so that gate in inverse operation receives such a voltage that the body diode is still currentless. In addition, a functional unit of the control circuit is set up to cause the switching element to assume the ON conducting state as a function of a commutation voltage or a commutation current, i.e., in inverse operation.

8 Claims, 3 Drawing Sheets

ELECTRONIC SWITCH FOR USE WITH INDUCTIVE LOADS

FIELD OF THE INVENTION

The present invention relates to an electronic switch which can be used with inductive loads and which permits high swithching rates. The switch is designed like a semiconductor switch with the mode of operation of at least one FET, so that the switch is also designed with an internal body diode in inverse operation due to the technology, where the gate is triggered by a first control circuit for operational activation and deactivation.

BACKGROUND INFORMATION

With FETs, in particular MOS FETs, the body diode in inverse operation which is present because of the technology often causes problems in practice. This body diode, which is parallel to the source drain path, is polarized in the reverse direction in operation. With inductive loads, a commutation current or commutation voltage that occurs when the current is stopped or reversed may flow across the body diode. With the conventional MOS FETs, for example, the conducting-state voltage of the body diode in inverse operation is 0.8 to 1.2 V. The reverse recovery time depends on the model, amounting to about 150 ns with 50 V semiconductors and increasing to about 2 µs at a higher reverse voltage.

Since semiconductor switches like MOS FETs are very fast switches, there are those who would also like to use them at high switching rates. With inductive loads such as transformers, throttles and motors, high losses occur due to stored charges at high switching rates in the body diode in inverse operation.

The losses that often occur at high switching rates in practice have led to various proposals to remedy the situation:

By special heavy metal doping of the FET body diode, the stored charges with FREDFETs can be minimized without affecting the other parameters of the semiconductor switch (FREDFET=fast-recovery epitaxial diode field effect transistor). However, the losses caused by the stored charges that nevertheless remain are so high at high switching rates that they interfere with switching performance. In addition, the conducting state power losses of the body diode increase with a reduction in stored charge.

According to another conventional method, an external free-wheeling diode is used to bridge a series connection of the FET and a diode polarized in the conducting direction in the working direction of the FET. Thus, the path across the semiconductor switch is blocked in inverse operation by the diode arranged in series and a current path is provided through the bridging diode. This assures that in inverse operation no current can flow across the semiconductor switch and thus its body diode. Very fast diodes such as Schottky diodes are used for such diodes. Losses due to a stored charge are thus greatly reduced, but disadvantages include the increased cost of the additional special diodes and especially the switching losses in these diodes.

The object of the present invention is to develop an electronic switch of the type defined in the preamble that will be suitable for high switching rates even with inductive loads without having the disadvantages that were previously unavoidable.

SUMMARY OF THE INVENTION

An electronic device according to the present invention includes a control circuit to execute the operating commands, which is set up so that the gate receives such a voltage in inverse operation that the gate-source voltage is set high enough for the body diode to be currentless, with the semiconductor switch set to the "ON" conducting state as a function of a commutation voltage or commutation current that occurs when switched off under an inductive load.

Losses are largely prevented by a suitable semiconductor material and a control circuit which, through a functional unit in inverse operation, is responsible for the fact that, contrary to previous practice, the operating path of the semiconductor switch is caused to be conducting again at the operating command "switch off" when a commutation voltage occurs. The semiconductor switch can be advantageously composed of silicon carbide (SiC). This ensures that the voltage drop at the ON resistor $R_{ON}$ is smaller than the threshold voltage or forward voltage of the body diode in inverse operation. The control circuit for executing the operating commands, such as turning on or off or assuming an intermediate state, must then be supplemented only by a circuit that applies a voltage to the gate that makes the operating path conducting as a function of the voltage at the drain and source of the semiconductor in inverse operation as long as the voltage of the inverse state is applied. For example, voltages. of one polarity can be switched with one FET, and alternating voltages and the respective currents can be switched with two FETs in antiserial connection.

Losses due to the charge storage characteristics of the body diode that would otherwise be conventional are avoided by such an electronic switch; high switching rates with extremely low losses are also made possible even with inductive loads.

According to one embodiment of the present invention, the control function that operates according to the commutation voltage or the commutation current is implemented essentially by a comparator whose positive input is connected to the terminal for the drain and whose negative input is connected to the terminal for the source, with the output of the comparator sent to the gate in accordance with its function. In particular, the output of the comparator may be connected to the gate of the semiconductor switch across a directional valve. The directional valve (e.g. a diode) is responsible for the semiconductor being caused to assume its current-carrying state across its gate as long as the drain-source voltage is polarized for inverse operation. The control function works essentially as a function of the commutation voltage.

According another embodiment of the present invention a control function that works as a function of the commutation current may be implemented essentially by a current-to-voltage converter that is wired with its current input connected in series with the semiconductor switch and its voltage output functionally connected to the gate. In particular, the current-to-voltage converter may be wired with its voltage output connected directly to the gate of the semiconductor switch across a directional valve.

DETAILED DESCRIPTION OF THE INVENTION

Figure 1:
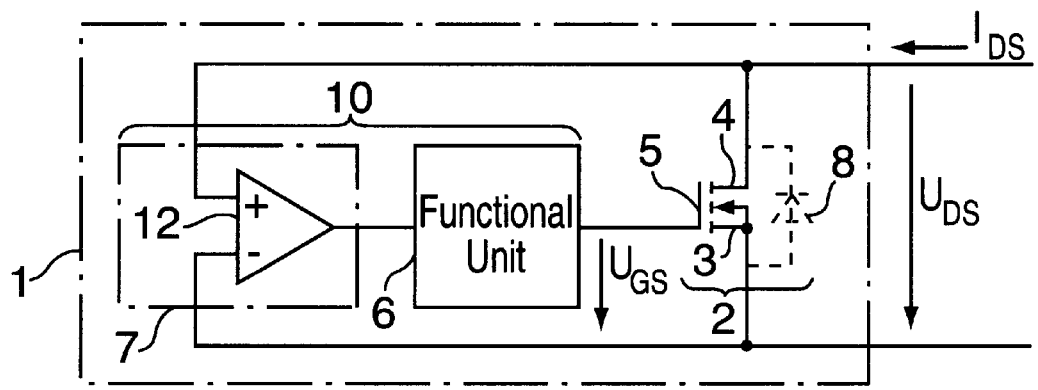
FIG. 1 shows an electronic switch according to the present invention.

Electronic switch 1 showing in to FIG. 1 works with a switching element 2 of the type of a semiconductor switch that functions like an FET. The electron donor is denoted as source 3, the electron collector is denoted as drain 4 and the electrode controlling the flow of electrons is denoted as gate 5. The mode of operation of an FET is understood here to refer to the fact that the switching element has characteristic curves such as those commonly associated with FETs. The switching element also works with an internal body diode 8 in inverse operation. On gate 5, control circuit 10 operates with a functional unit 6 to execute the operating commands and a functional unit 7 to cause switching element 2 to assume the "ON" conducting state as a function of a commutation voltage or a commutation current as long as the commutation situation prevails.

Functional unit 7 of control circuit 10 that operates as a function of the commutation voltage or commutation current may be implemented essentially by a comparator 12 whose positive input is connected to the terminal for the drain 4 and whose negative input is connected to the terminal for the sources; the output of comparator 12 is functionally sent to gate 5 of switching element 2.

Figure 2:
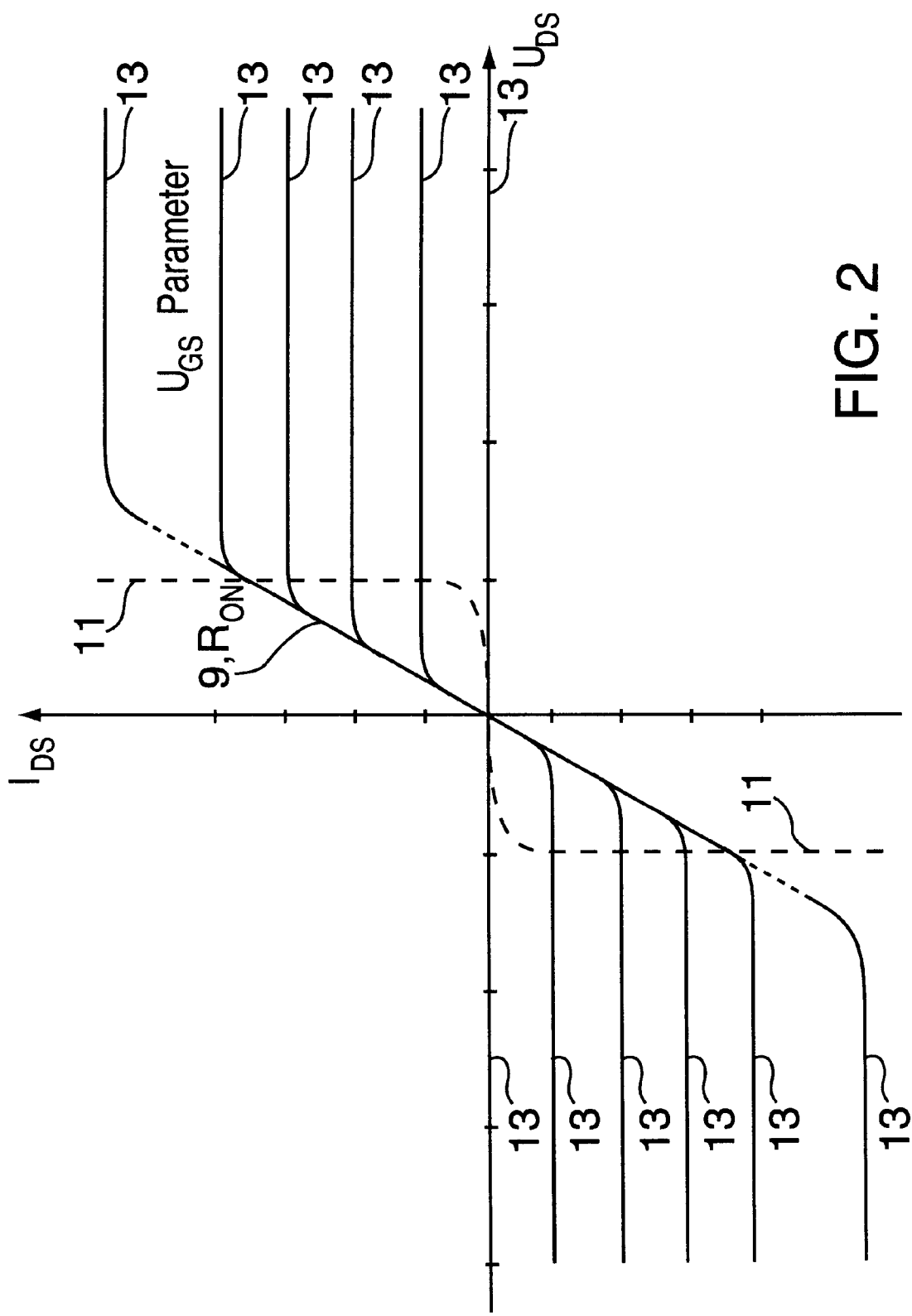
FIG. 2 shows an operating diagram of the electronic switch illustrated in FIG. 1.

FIG. 2 shows a field of characteristic curves, where the family of characteristic curves 13 in the first quadrant illustrates the behavior of switching element 2 for a drain-source current $I_{DS}$ and a drain-source voltage $U_{DS}$ as a function of the gate-source voltage $U_{GS}$ as a parameter. The off state is represented by the abscissa. With an increase in gate-source voltage $U_{GS}$ characteristic curves 13 approach line 9, $R_{ON}$, progressively, starting at the point of origin. When considered from a different standpoint, at a high gate-source voltage a steep characteristic curve 9 is achieved, which is generally understood as an ON resistor, because it shows a linear relationship between current and voltage. A steep line 9 corresponds to a low ON resistor. With an antiserial circuit of two switching elements 2, characteristic curves 13 and $R_{ON}$ run in the first and third quadrants. Using the body diode 8 in inverse operation results in superimposition of the characteristics field with a characteristic curve 11 in the third quadrant in relation to characteristics field 13 in the first quadrant and a characteristic curve 11 in the first quadrant in relation to characteristics field 13 in the third quadrant.

With a single switching element 2, characteristic curves 13 in the first quadrant are supplemented by characteristic curve 11 of the body diode 8 in the third quadrant. This characteristic curve 11 illustrates the fact that the body diode 8 acts parallel to the operating path of the switching element in the reverse direction. This action can be avoided by setting the gate-source voltage on the switching element 2 in an inverse operation so high that the body diode 8 still remains currentless. This is promoted in practice by providing a switching element 2 made of silicon carbide in the structure of an FET. Other materials that belong to the insulator group without doping, such as diamond, can also be used. With SiC in the 6H modification, the intrinsic conductivity is $1.6 \times 10^6$ charge carriers per $cm^3$, i.e., it is lower by a factor of $10^{15}$ than that of silicon. High reverse voltages can be achieved with such materials, so that for a reverse voltage of 5 kV, for example, that is to be isolated, an active element thickness of approx. 50 μm is sufficient in the case of silicon carbide, which results in a very low $R_{ON}$. Accordingly, the losses in the conducting state are negligible.

Figure 3:
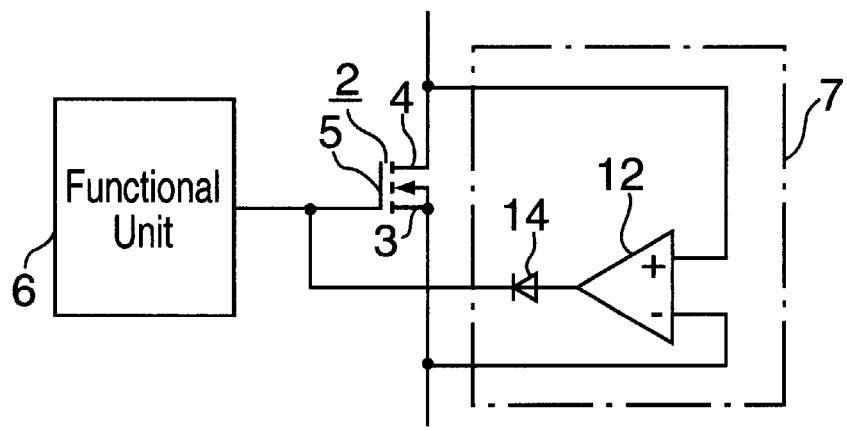
FIG. 3 shows an embodiment of the electronic switch according to the present invention, where the control function that operates as a function of the commutation voltage is implemented by a comparator whose output is connected directly across a directional valve to the gate of the semiconductor switch.

FIG. 3 shows functional unit 6 of the control circuit for execution of the operating commands by a functional unit 7 for controlling the switching element as a function of the commutation voltage. The functional unit 7 consists of a comparator 12 whose positive input is connected to drain 4 and whose negative input is connected to source 3 and whose output is connected to gate 5 of switching element 2 across a directional valve. For example, if there is a positive potential at drain 4 and a negative potential at source 3, which would correspond to a normal operating situation, comparator 12 does not deliver any voltage at its output. Through functional unit 6 of the control circuit, a certain conductivity of switching element 2 can be set through an appropriate gate-source voltage at gate 5. With certain network states or loads, such as inductive loads, a commutation voltage can occur when the conductivity of switching element 2 is reduced to zero, so that there is a negative potential at drain 4 and a positive potential at source 3. Under such conditions, comparator 12 delivers at its output a positive voltage that goes over directional valve 14 to gate 5, so switching element 2 is again converted to a conducting state as long as this inverse state prevails.

Figure 4:
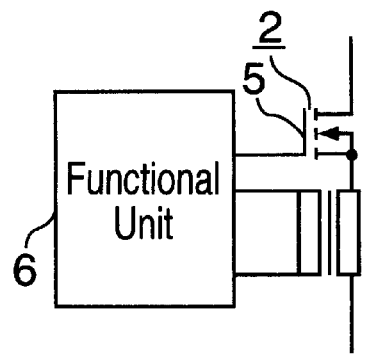
FIG. 4 shows another embodiment of the electronic switch according to the present invention where the control function that operates as a function of the commutation current is implemented by a current-to-voltage converter.
Figure 5:
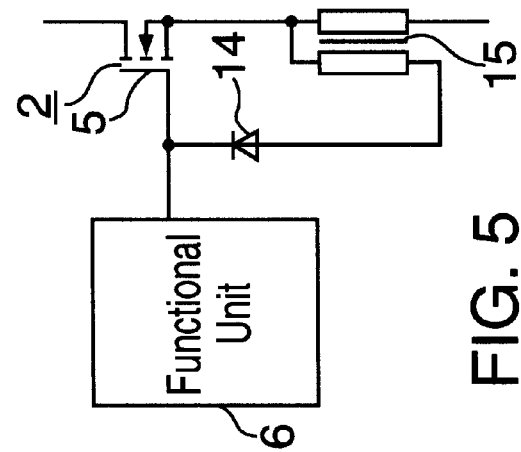
FIG. 5 shows another embodiment of the electronic switch according to the present invention, where the voltage output of the current-to-voltage converter is connected directly to the gate of the semiconductor switch across a directional valve.

In another embodiment according to the present invention shown in FIG. 4, the functional unit, which operates in accordance with the commutation current, of the control circuit is implemented essentially by current-to-voltage converter 15, which is wired with its current input in series with switching element 2 and with its voltage output functionally connected to gate 5. In the embodiment of the present invention shown in FIG. 5, the voltage output of current-to-voltage converter 15 is connected directly to gate 5 of switching element 2 across directional valve 14.

Figure 6:
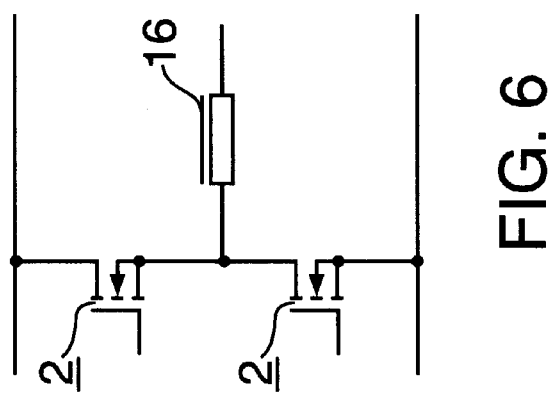
FIG. 6 shows an antiserial arrangement of electronic switches with an inductive load connected in the middle of the type of a half-bridge such as those which belong to the related art with traditional semiconductor switches and may also be implemented with electronic switches according to the present invention.

Another arrangement shown in FIG. 6 of electronic switches according to the present invention may be advantageous when alternating currents are to be switched and an inductive load 16 is connected.

Figure 7:
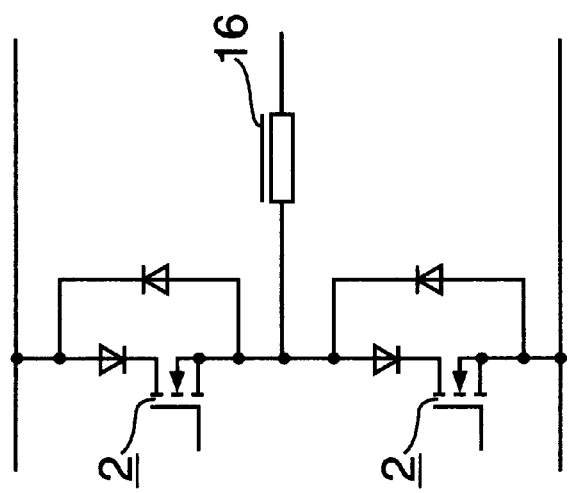
FIG. 7 shows an antiserial arrangement of semiconductor switches according to the related art with known measures to reduce the losses due to stored charges.

Yet another arrangement shown in FIG. 7 illustrates a conventional measure with a diode in the reverse direction with an FET and a diode bridging the series diode and the FET. Otherwise the arrangement shown in FIG. 7 corresponds to the arrangement shown in FIG. 6 for the case when each arrangement is fitted with conventional elements.

What is claimed is:

1. An electronic switch comprising:
   a switching element operating as a FET and including an inversely operating internal body diode; and
   a control circuit executing operating commands and providing a control voltage to a gate of the switching element, the control circuit generating a high gate-source voltage to maintain the inversely operating internal body diode currentless, the control circuit including a functional unit for controlling the switching element to be in an on conducting state as a function of one of a commutation voltage and a commutation current, the functional unit including a comparator and a directional valve, wherein an output of the comparator is connected to the gate of the switching element via the directional valve, and wherein a first input of the comparator is connected to a source of the switching element, and a second input of the comparator is connected to a drain of the switching element.

2. The electronic switch according to claim 1, wherein the functional unit includes a current-to-voltage converter, a current input of the current-to-voltage converter coupled in series with the switching element and a voltage output of the current-to-voltage converter coupled to the gate of the switching element.

3. The electronic switch according to claim 2, wherein the voltage output of the current-to-voltage converter is coupled to the gate of the switching element via the directional valve.

4. The electronic switch according claim 1, wherein the switching element is composed of silicon carbide (SiC).

5. The electronic switch according to claim 2, wherein the switching element is composed of silicon carbide (SiC).

6. The electronic switch according to claim 1, wherein the switching element has first characteristic curves in a first quadrant and the internal body diode has a second characteristic curve in the third quadrant, the first characteristic curves of the switching element being supplemented by the second characteristic curve of the internal body diode.

7. The electronic switch according to claim 1, wherein the switching element has first characteristic curves in a third quadrant, and the internal body diode has a second characteristic curve in a first quadrant, the first characteristic curves of the switching element being supplemented by the second characteristic curve of the internal body diode.

8. The electronic switch according to claim 1, wherein the directional valve is a single directional valve connected between the output of the comparator and the gate of the switching element.

* * * * *